United States Patent [19]

Iyengar

[11] Patent Number: 5,285,419
[45] Date of Patent: Feb. 8, 1994

[54] READ/WRITE MEMORY WITH IMPROVED TEST MODE DATA COMPARE

[75] Inventor: Narasimhan Iyengar, Plano, Tex.

[73] Assignee: SGS-Thomson Microelectronics, Inc., Carrollton, Tex.

[21] Appl. No.: 809,393

[22] Filed: Dec. 17, 1991

[51] Int. Cl.$^5$ ............................................. G11C 29/00
[52] U.S. Cl. ..................................... 365/201; 371/21.1
[58] Field of Search .............. 365/201; 371/68.1, 21.1; 307/355; 340/146.2

[56] References Cited

U.S. PATENT DOCUMENTS

| | | | |
|---|---|---|---|
| 4,654,849 | 3/1987 | White, Jr. et al. | 371/21 |
| 4,694,274 | 9/1987 | Shimada | 340/146.2 |
| 4,860,259 | 8/1989 | Tobita | 365/201 |
| 5,121,358 | 6/1992 | Slemmer | 365/226 |

OTHER PUBLICATIONS

McAdams, et al., "A 1-Mbit CMOS Dynamic RAM With Design-For-Test Functions", *IEEE Journal of Solid-State Circuits*, vol. SC-21, No. 5 (Oct. 1986), pp. 635-642.

Shimada et al., "A 46-ns 1-Mbit CMOS SRAM", *IEEE Journal of Solid-State Circuits* vol. 23, No. 1 (Feb. 1988) pp. 53-58.

Primary Examiner—Eugene R. LaRoche
Assistant Examiner—A. Zarabian
Attorney, Agent, or Firm—Rodney M. Anderson; Lisa K. Jorgenson; Richard K. Robinson

[57] ABSTRACT

An integrated circuit having a memory with a parallel test data comparator is disclosed. The parallel test data comparator includes a NOR-like function which has parallel transistors having their gates connected to an input from each of the internal data lines, and a NAND-like function which also has parallel transistors having their gates connected to an input from each of the internal data lines. The output nodes of each function are biased by single transistors, each controlled by a test enable signal, and each of which can be overpowered by any one of the parallel transistors. In the event that all of the internal data lines are at the same logic level, the outputs of the NOR and NAND will be at the same logic level; conversely, if any one (or more) of the internal data lines is different from the rest, the outputs of the NOR and NAND will be at different logic levels. An exclusive-OR-like function is used to generate a pass or fail signal responsive to the output nodes of the NOR and NAND.

17 Claims, 2 Drawing Sheets

READ/WRITE MEMORY WITH IMPROVED TEST MODE DATA COMPARE

This invention is in the field of integrated circuits, and is more specifically directed to memory integrated circuits and special test modes therein.

BACKGROUND OF THE INVENTION

In modern high density memories, such as random access memories having $2^{20}$ bits (1 Megabit) or more, the time and equipment required to test functionality and timing of all bits in the memory constitutes a significant portion of the manufacturing cost. Accordingly, as the time required for such testing increases, the manufacturing costs also increase. Similarly, if the time required for the testing of the memory can be reduced, the manufacturing cost of the memories is similarly reduced. Since the manufacturing of memory devices is generally done in high volume, the savings of even a few seconds per device can result in significant cost reduction and capital avoidance, considering the high volume of memory devices produced.

Random access memories (RAMs) are especially subject to having significant test costs, not only because of the necessity of both writing data to and reading data from each of the bits in the memory, but also because RAMs are often subject to failures due to pattern sensitivity. Pattern sensitivity failures arise because the ability of a bit to retain its stored data state may depend upon the data states stored in, and the operations upon, bits which are physically adjacent to a particular bit being tested. This causes the test time for RAMs to be not only linearly dependent upon its density (i.e, the number of bits available for storage) but, for some pattern sensitivity tests, dependent upon the square (or 3/2 power) of the number of bits. Obviously, as the density of RAM devices increases (generally by a factor of four, from generation to generation), the time required to test each bit of each device in production increases at a rapid rate.

It should be noted that many other integrated circuit devices besides memory chips themselves utilize memories on-chip. Examples of such integrated circuits include many modern microprocessors and microcomputers, as well as custom devices such as gate arrays which have memory embedded therewithin. Similar cost pressures are faced in the production of these products as well, including the time and equipment required for testing of the memory portions.

A solution which has been used in the past to reduce the time and equipment required for the testing of semiconductor memories such as RAMs is the use of special "test" modes, where the memory enters a special operation different from its normal operation. In such test modes, the operation of the memory can be quite different from that of normal operation, as the operation of internal testing can be done without being subject to the constraints of normal operation.

An example of a special test mode is an internal "parallel", or multi-bit, test mode. Conventional parallel test modes allow access to more than one memory location in a single cycle, with common data written to and read from the multiple locations simultaneously. For memories which have multiple input/output terminals, multiple bits would be accessed in such a mode for each of the input/output terminals, in order to achieve the parallel test operation. This parallel test mode of course is not available in normal operation, since the user must be able to independently access each bit in order to utilize the full capacity of the memory. Such parallel testing is preferably done in such a way so that the multiple bits accessed in each cycle are physically separated from one another, so that there is little likelihood of pattern sensitivity interaction among the simultaneously accessed bits. A description of such parallel testing may be found in McAdams et al., "A 1-Mbit CMOS Dynamic RAM With Design-For-Test Functions", *IEEE Journal of Solid-State Circuits*, Vol SC-21, No. 5 (October 1986), pp. 635–642.

As described in this article, conventional parallel test operations may be done in one of two ways. A first one of these methods merely compares the data state read from each of the multiple simultaneously accessed bits with one another. If all of the simultaneously accessed bits have the same data, the test operation passes. A second method for parallel test, commonly referred to as "expected data parallel test", is performed by comparing the data presented by the accessed bits against one another, and also against the contents of an on-chip register to determine not only that the same data was read from all accessed bits, but also that the data state read was the correct data state.

For either case, the internal comparison of multiple sensed data states must be performed on-chip, with the results communicated externally therefrom. In the McAdams et al. article cited hereinabove, relative to its FIG. 8, a multiple stage comparator is provided which receives internal data lines DL0 through DL7 and performs a comparison among the same (and with expected data ED if desired). In this example, however, each internal data line is connected to both an input of a NAND function and also an input of an OR function. It is therefore contemplated that the internal data line loading presented by the parallel comparator described in the McAdams et al. article is significant, and will slow the performance of the internal read path during normal operation. Furthermore, the layout area required for the comparator of the McAdams et al. article (including eleven logic functions, one of which is an exclusive-OR), is believed to be substantial.

By way of further background, U.S. Pat. Nos. 4,654,849 and 4,860,259 describe other parallel test schemes. The multiple bit comparators disclosed in these references (see FIGS. 1 and 8 of U.S. Pat. No. 4,654,849, and FIGS. 4A and 7B of U.S. Pat. No. 4,860,259) are each configured as static logic gates, similarly as in the McAdams et al. article, and are thus believed to suffer from similar increases in internal data bus loading and the resulting performance degradation in normal operation, and also from significant layout and chip area pressures.

Another known technique for performing an internal parallel comparison in test mode is described in Shimada et al., "A 46-ns 1-Mbit CMOS SRAM", *IEEE Journal of Solid-State Circuits*, Vol. 23, No. 1, (Feb. 1988) pp. 53–58. As described in this article relative to its FIG. 5, parallel test is accomplished in this device by the simultaneous access of four of the array blocks. The comparison of the data retrieved from the four accessed bits is accomplished by arbiter buffers, which drive lines BUS and BUS_ in wired-AND fashion. As noted on page 55, since the p-channel pull-up transistors in the arbiter buffers are small, if any of the four selected cells fails (e.g., has a "0" instead of a "1"), both of lines BUS and BUS_ will be at a low logic level. The operation of the NAND gates will, in such a case, will provide a "1" input to both of the NORs driving the pull-up and pull-down transistors of the output buffer, forcing a high-impedance state at the output of the device.

As is evident from this construction, however, it is apparent that the arbiter buffers are connected in series in the data path between the sense amplifiers and the data out terminal both for normal and parallel test modes. Accordingly, the propagation delay required by the arbiter buffers is also seen during normal operation, so that an access time penalty is paid in order to implement the parallel test comparison. This penalty is made worse by the construction of the arbiter buffers in such a way that the p-channel pull-up transistors are sufficiently small so that a single n-channel pull-down transistor (in the example of a test failure due to reading a "0" instead of a "1") can pull down line BUS or BUS_ which is being pulled high by the other three p-channel transistors. This small size for the pull-up devices will, of course, result in a slow transition time for a line BUS or BUS_ going from a low to a high logic level for a read operation. Furthermore, the slow transition time will become even worse if the parallel test design goes from a by-four test to a by-eight or wider parallel test operation, since a single n-channel transistor must be capable of pulling down a node being pulled up by seven, or fifteen in the case of a by-sixteen test, p-channel pull-up transistors. Accordingly, the scheme described in the Shimada et al. paper will become less useful for wider parallel test operations. Of course, as memories become larger and larger, it will become desirable to test even more bits in parallel.

By way of further background, copending application Ser. No. 552,567, filed Jul. 13, 1990, assigned to SGS-Thomson Microelectronics, Inc., and incorporated herein by this reference, describes a static random access memory (SRAM) including a parallel test mode; the results of the parallel test are communicated at the data output terminals, with a high-impedance state indicating a failed parallel comparison for a particular input/output. The SRAM device described in this copending application utilizes a series of comparators for comparing multiple internal data lines in a parallel test mode. As described relative to FIG. 3 of copending application Ser. No. 552,567, pairs of data words are compared in bit-by-bit fashion by a series of comparators, with a final signal generated according to the results of the comparison, and coupled to the output drivers.

It is an object of the present invention to provide a memory having a parallel test mode which presents minimal loading to internal data bus lines.

It is a further object of the present invention to provide such a memory which includes a parallel test multiple-bit data comparator which is outside of the internal data path in normal operation.

It is a further object of the present invention to provide such a memory which presents minimal propagation delay in the parallel test multiple-bit comparison.

It is a further object of the present invention to provide such a memory which may be efficiently laid out in relatively small chip area.

Other objects and advantages of the present invention will be apparent to those of ordinary skill in the art having reference to the following specification together with the drawings.

SUMMARY OF THE INVENTION

The invention may be implemented into a read/write memory, such as a static random access memory (SRAM) having a parallel test mode. A comparator is coupled to each of the internal data lines within the chip, in parallel with the data path in normal read operations. The comparator receives each of the internal data lines at a gate of a pull-up transistor in a first stage, and at a gate of a pull-down transistor in a second stage. The first stage also includes a pull-down transistor controlled by the test enable signal, and the second stage includes a pull-up transistor controlled by the test enable signal. The common drain nodes in the first and second stage present the result of the comparison, as each of the transistors receiving an internal data line at its gate is sized to overpower the control pull-down and pull-up transistors in the first and second stages, respectively. The logical combination of the common drain nodes thus will provide an indication of successful and unsuccessful comparisons, while reducing the parasitic load on the internal data lines.

DETAILED DESCRIPTION OF THE PREFERRED EMBODIMENT

Figure 1:
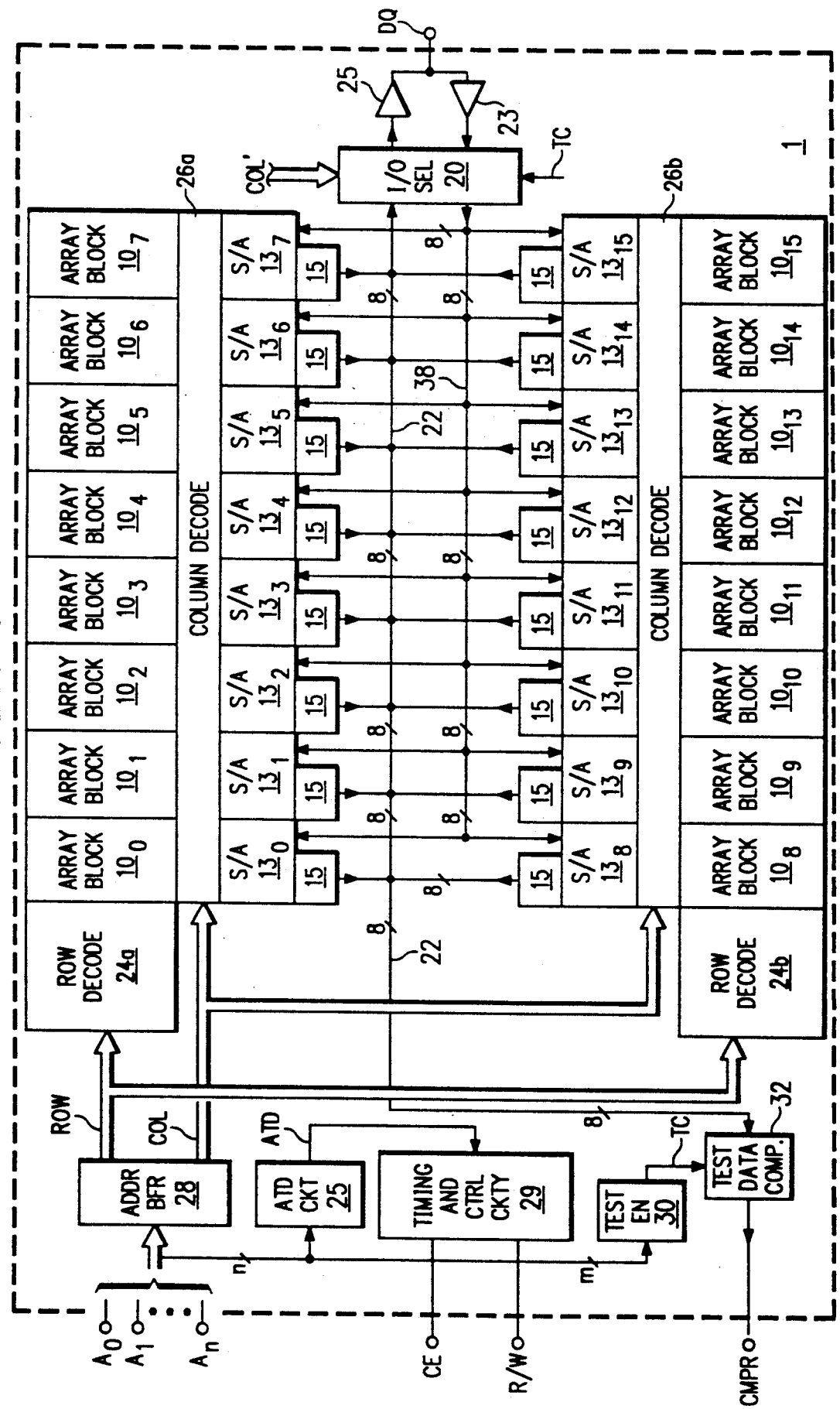
FIG. 1 is an electrical diagram, in block form, of a memory incorporating the preferred embodiment of the invention.

Referring now to FIG. 1, an example of an integrated circuit into which the preferred embodiment of the invention is implemented will be described. In this example, memory 1 is a static random access memory (SRAM) of otherwise conventional architecture, having its memory cells in multiple blocks 10 which are shown, in FIG. 1, according to an example of their physical location in such a memory. It is contemplated that integrated circuits of other types which utilize long data conductors may also benefit from the present invention, such integrated circuits including microprocessors, logic devices, and other types of memories including read-only memories, FIFOs, DRAMs and the like.

As is conventional, memory cells in memory 1 are arranged in rows and columns, and are selected according to an address signal received at address terminals $A_0$ through $A_n$. Address terminals $A_0$ through $A_n$ are connected to address buffers 28, which buffer the received address signal and communicate a portion of the address signal to row decoders 24a, 24b on bus ROW, and communicate the remainder to column decoders 26a, 26b on bus COL. Row decoders 24a, 24b select a row of memory cells by enabling the selected word line, in the conventional manner, and are thus preferably located along a side of the memory array blocks 10. Column decoders 26a, 26b, in this example, select eight memory cells in the selected row to be sensed by a sense amplifier 13 according to the column portion of the address.

In memory 1 according to this example, the memory cells are grouped into sixteen array blocks $10_0$ through $10_{15}$. This partitioning of the memory into sixteen array blocks 10 is particularly beneficial in low power memories, such as may be used in portable computers, as only the block 10 in which the selected memory cells are located need be enabled during a cycle. Selection of the block may be done according to one of the row address bits (indicating upper or lower half) and to four of the column address bits (indicating one of sixteen array blocks 10 to be selected). Further reduction in the active power may be obtained by the implementation of latched row line repeaters between array blocks 10, as described in copending application Ser. No. 588,609, filed Sep. 26, 1990, now U.S. Pat. No. 5,121,358, issued Jun. 9, 1992, assigned, to SGS-Thomson Microelectronics, Inc., and incorporated herein by this reference.

Memory 1, as in the case of most modern SRAMs and DRAMs, includes some amount of dynamic operation, such as precharging and equilibrating certain nodes (e.g., bit lines) at particular points in the memory cycle. Initiation of the cycle in SRAM 1 occurs by way of address transition detection, performed by address transition detection (ATD) circuit 25. ATD circuit 25 is connected to each of the address inputs $A_0$ through $A_n$, preferably prior to address buffers 28 (as shown), and generates a pulse on line ATD responsive to detecting a transition at any one or more of address inputs $A_0$ through $A_n$, such a pulse useful in controlling the internal operation of memory 1 in the conventional manner, and also in the manner to be described hereinbelow.

Other internal operational functions are controlled by timing and control circuitry 29, which receives the signal on line ATD from ATD circuit 25, and which also receives certain external control signals such as the chip enable signal at terminal CE, and the read/write select signal at terminal R/W_. Timing and control circuitry 29 generates various control signals based on these inputs, for control of the various functions within memory 1, in the conventional manner. The control signals are not shown in FIG. 1, for purposes of clarity.

Each of array blocks $10_0$ through $10_{15}$ is associated with a corresponding group of sense/write circuits $13_0$ through $13_{15}$, as shown in FIG. 1. In this example, eight individual sense/write circuits are included within each group of sense/write circuits $13_0$ through $13_{15}$, one for each of the eight bits to be communicated on internal read data bus 22 from the selected one of array blocks $10_0$ through $10_{15}$. Each of sense/write circuits 13 include both a sense amplifier and a write driver, as will be explained in further detail hereinbelow. Groups of data drivers 15 are each associated with a corresponding group of sense amplifiers $13_0$ through $13_{15}$ for receiving the data signal therefrom and for driving read data bus 22 therewith; individual data drivers 15 are associated with individual sense/write circuits 13 in each group, one data driver 15 for driving each line in read data bus 22. It is preferred that data drivers 15 have a high-impedance mode, to avoid bus conflict and to allow precharge, as described in copending application Ser. No. 809,735, filed Dec. 17, 1991, assigned to SGS-Thomson Microelectronics, Inc., and incorporated herein by this reference.

In this example, the memory array is also divided into halves, with array blocks $10_0$ through $10_7$ in one array half and array blocks $10_8$ through $10_{15}$ in the other half. Read data bus 22 runs the length of the array halves, and is located therebetween as shown in FIG. 1. Each individual data conductor in read data bus 22 is connected to a corresponding data driver in each of the sixteen data driver groups 15 of the sixteen array blocks $10_0$ through $10_{15}$. For a read/write memory such as memory 1, input data bus 38 is also connected to each of sense/write circuits 13, for communicating input data to be written to the selected memory cells in the conventional manner. Alternatively, the input data may also be communicated in time-multiplexed fashion along read data bus 22, as is conventional for some memory designs.

For purposes of fast read access times, it may be preferred to also include, within read data bus 22, one dummy data conductor associated with each of the data conductors, in the manner described in the above-referenced copending application Ser. No. 809,735. As described therein, each dummy data conductor is driven to a complementary state relative to its associated data conductor, such that precharging of the data conductors in read data bus 22 can be accomplished by way of charge sharing between the two.

Memory 1 in this example has a single input/output terminal DQ at which data is presented in read operations or at which data is received in write operations. Input buffer 23 and output buffer 25 are thus connected to terminal DQ, and are controlled by timing and control circuitry 29 in the conventional manner according to whether a read or a write operation is being selected. Input buffer 23 is of conventional construction in the art for receiving input data and communicating the same. Output buffer 25 is a tristate buffer of conventional construction, or preferably is constructed as described in copending application Ser. No. 809,387, filed Dec. 17, 1991 assigned to SGS-Thomson Microelectronics, Inc., and incorporated herein by this reference.

As discussed hereinabove, each access of memory 1 according to this embodiment of the invention places eight memory cells in the selected array block 10 in communication with input data bus 38 or read data bus 22, for write and read operations, respectively. Since memory 1 is of by-one organization, I/O select circuit 20 is connected to both input data bus 38 and read data bus 22, and receives a portion of the column address on bus COL' which indicates which of the lines in input data bus 38 is to be placed in communication with input buffer 23 in a write operation, or which of the lines in read data bus 22 is to be placed in communication with output buffer 25 in a read operation. I/O select circuit 20 also receives a control signal on line TC from test enable circuit 30, as will be described hereinbelow.

Memory 1 further includes test enable circuitry 30 for controlling the entry into and exit from special test modes, such as internal parallel test. In this example of memory 1, test enable circuitry 30, is constructed as described in copending application Ser. No. 568,968, filed Aug. 17, 1990, now U.S. Pat. No. 5,161,159, issued Nov. 3, 1992, assigned to SGS-Thomson Microelectronics, Inc., and incorporated herein by this reference. As such, test enable circuitry 30 receives a subset of m inputs from address terminals $A_0$ through $A_n$, from which it determines if test mode is to be entered, and communicates a signal on line TC (active low) to enable parallel test mode, in this example. For example, as described in said copending application Ser. No. 568,968, one of the m address inputs may serve as a clocking signal when in an overvoltage or undervoltage condition, with others of the m address inputs presenting a code sequence to test enable circuitry 30 with each pulse of the clocking signal; the code sequence indicates if a special test mode is to be entered and, if multiple test modes are available, which one of the test modes is selected. Of course, other conventional circuits and methods for entry into test mode may alternatively be used in memory 1, including a spare test mode terminal, the detection of overvoltage conditions on clock terminals, and the like.

Line TC from test enable circuit 30 is communicated to I/O select 20 for controlling its operation. In particular, during parallel test mode it is preferred that the same data state be written to all eight internally-selected locations from the single terminal DQ in one cycle. As such, test enable circuit 30 can control I/O select 20, by line TC, so that all eight lines in input data bus 38 are driven by input buffer 23 in parallel test mode write operations.

Line TC from test enable circuit 30 is also coupled to test data comparator 32 according to this embodiment of the invention, for enabling the same as will be described hereinbelow. Test data comparator 32 also receives data line from each of the data conductors of read data bus 22 on which data drivers 15 drive the state of the eight selected memory cells in a read operation. The location of test data comparator 32 shown in FIG. 1 is not indicative of its physical location in memory 1, as it is preferable that the length of data bus 22 connected thereto be kept as short as practicable, to reduce loading effects in normal operation.

Test mode comparator 32, in this embodiment of the invention, compares the data state of all eight lines of data bus 22 and issues a signal on line CMPR indicating the result of the comparison. In this example, a low level on line CMPR during test mode indicates that all eight lines of data bus 22 have the same data state (a "pass" condition) and a high level on line CMPR during test mode indicates that different ones of the lines of data bus 22 have different data states (a "fail" condition). Line CMPR may be presented at an external terminal of memory 1, for example when memory 1 is in wafer form. Alternatively, line CMPR may be used to control the state of another terminal, such as terminal DQ, to communicate the results of the comparison thereat; such construction is preferred for parallel test of memory 1 in packaged form, as the number of external terminals for memory integrated circuits is preferably minimized. The above-cited copending application Ser. No. 552,567, filed Jul. 13, 1990, assigned to SGS-Thomson Microelectronics, Inc., and incorporated herein by reference, describes an arrangement for placing an output terminal, such as terminal DQ, in a high impedance state to indicate a failed parallel test read. Other conventional techniques for communicating the result of the parallel test comparison may alternatively be used in connection with test data comparator 32, under the control of line CMPR issued therefrom.

Figure 2:
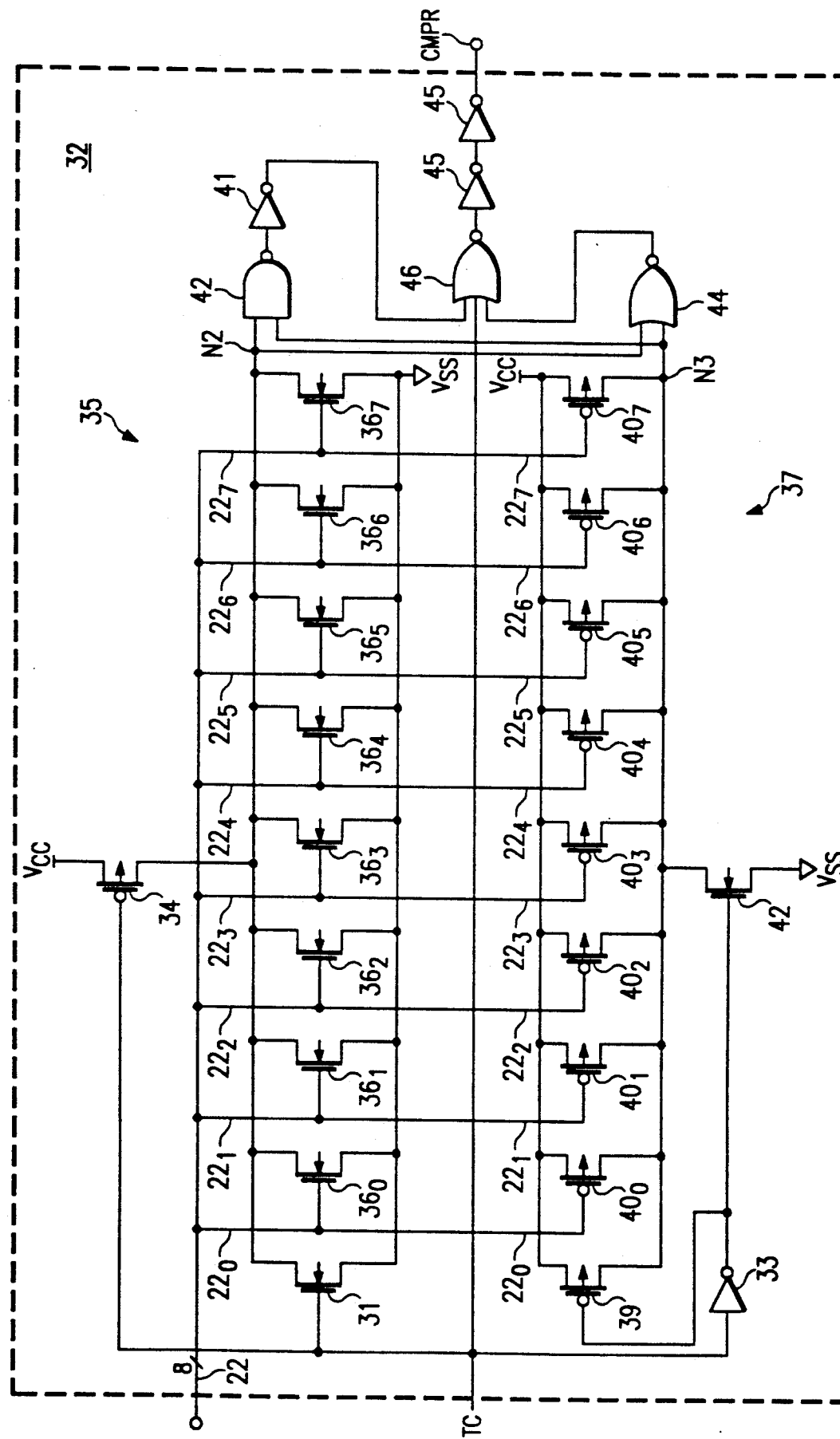
FIG. 2 is an electrical diagram, in schematic form, of a multiple-bit data comparator for parallel test mode purposes in the memory of FIG. 1.

Referring now to FIG. 2, the construction and operation of test data comparator 32 according to the preferred embodiment of the invention will now be described in detail. Test data comparator 32 includes eight-bit NOR function 35 and eight-bit NAND function 37 which perform the comparison of the eight lines of data bus 22, and communicate the same on nodes N2, N3, respectively. As will be apparent from the following description, the construction of NOR function 35 and NAND function 37 according to the present invention presents minimal load on read data bus 22, and may be done in relatively small chip area.

NOR function 35 includes p-channel pull-up transistor 34 having its source biased to $V_{cc}$, its drain connected to node N2, and its gate controlled by line TC. N-channel pull-down transistor 31 has its drain connected to node N2, its source biased to ground, and its gate also connected to line TC. Accordingly, when parallel test node is not enabled (line TC high), transistor 31 is on, transistor 34 is off, and node N2 is thus pulled low. In parallel test mode (line TC low), transistor 31 is off and transistor 34 is on, allowing transistor 34 to pull node N2 high.

NOR function 35 also includes eight n-channel transistors $36_0$ through $36_7$, each having its drain connected to node N2 and its source biased to ground; the gates of n-channel transistors $36_0$ through $36_7$ are connected to individual lines $22_0$ through $22_7$, respectively, of read data bus 22. It is preferred, in this embodiment of the invention, that each of transistors 36 have relatively strong drive relative to that of transistor 34, so that any one of transistors 36 can overpower transistor 34, and pull node N2 low, when both are on. For example, the W/L of transistor 34 may be on the order of four, while the W/L of each transistor 36 may be on the order of six or greater.

NAND function 37 is constructed in converse fashion relative to NOR function 35. N-channel transistor 42 has its source biased to ground, its drain connected to node N3, and its gate coupled to line TC via inverter 33. P-channel transistor 39 has its source biased to $V_{cc}$, its drain connected to node N3, and its gate also coupled to line TC via inverter 33. Accordingly, when parallel test mode is not enabled (line TC high), transistor 42 is off and transistor 39 is on, driving node N3 high. In parallel test mode, transistor 42 is on and transistor 39 is off, allowing transistor 42 to pull node N3 low.

NAND function 37 also includes eight p-channel transistors $40_0$ through $40_7$, each having its source biased to $V_{cc}$, its drain connected to node N3, and its gate connected to an individual data line $22_0$ through $22_7$, respectively, in read data bus 22. Similarly as in NOR function 35, the drive capability of each of transistors 40 in NAND function 37 is preferably greater than that of transistor 42, so that when both one of transistors 40 and transistor 42 are on, node N3 will be pulled high by the transistor 40. For example, the W/L of transistor 42 may be on the order of four, while the W/L of each transistor 40 may be on the order of six or greater.

Nodes N2 and N3 are each coupled to inputs of NAND function 42, and of NOR function 44. The output of NAND function 42 is connected, via inverter 41, to an input of NOR function 46, as is the output of NOR function 44. Line TC is also connected to an input of NOR function 46. The output of NOR function 46 drives line CMPR via a pair of inverters 45. The operation of NAND function 42 and NOR functions 44, 46, with their inverters 41, 45, in driving the state of line CMPR, is similar to an exclusive OR of nodes N2, N3, with a low level output forced by line TC high. The following truth table is illustrative of the state of line CMPR responsive to line TC and nodes N2, N3:

| TC | N2 | N3 | CMPR | |
|---|---|---|---|---|
| 1 | 0 | 1 | 0 | (parallel test disabled) |
| 0 | 1 | 1 | 0 | (test passes, all 0's) |
| 0 | 0 | 0 | 0 | (test passes, all 1's) |
| 0 | 0 | 1 | 1 | (test fails) |

The condition of TC low, N2 high, and N3 low cannot occur in this embodiment of the invention, as will be apparent from the following description.

In operation, when line TC is high, indicating that parallel test is not enabled, transistors 31 and 39 are both on and transistors 34 and 42 are both off, forcing node N2 low and node N3 high, regardless of the state of the lines of read data bus 22. As indicated by the truth table hereinabove, this is communicated by way of a low logic level on line CMPR.

When parallel test is enabled by operation of test enable circuit 30, driving line TC low, transistors 31 and 39 are turned off and transistors 34 and 42 are turned on. In this state, the logic states of read data bus 22 determine the state of nodes N2, N3, and thus the state of line CMPR. The result of a parallel read operation may thus be determined by test data comparator 32.

In this example, if all eight lines of read data bus 22 are at a high logic level, corresponding to a "1" stored in each of the eight accessed memory cells, all of n-channel transistors $36_0$ through $36_7$ in NOR function 35 will be turned on, and node N2 will accordingly be driven low. In addition, none of p-channel transistors $40_0$ through $40_7$ will be turned on; since transistor 42 is on due to line TC being low, node N3 will also be at a low level. Referring to the above truth table, the condition where line TC, and both of nodes N2, N3, are low forces a low logic level on line CMPR, indicating that the parallel read passes, as all eight accessed cells have the same data state (in this case a "1"). As described in the above-referenced copending application Ser. No. 552,567, the true data state may be communicated to terminal DQ, if desired.

Conversely, if all eight lines in read data bus 22 are low, indicating that a "0" is stored in each of the eight accessed memory cells, all of p-channel transistors $40_0$ through $40_7$ in NAND function 37 will be on, driving node N3 high; in addition, none of n-channel transistors $36_0$ through $36_7$ will be on, allowing transistor 34 (on by way of line TC being low) to pull node N2 high. As illustrated in the above truth table, this state of line TC low, and both of nodes N2, N3 high, will also cause a low logic level on line CMPR, again indicating a passing parallel test read.

If not all of the eight lines in read data bus 22 have the same data state, line CMPR will be driven high, indicating a fail. For example, if read data line $22_2$ is high while all of the other test data lines are low (i.e., if the accessed memory cell associated with read data bus line $22_2$ has an incorrect data state), n-channel transistor $36_2$ in NOR function 35 will be on (and all other transistors 36 are off). As noted hereinabove, because each of transistors 36 has significantly greater drive than that of transistor 34 in NOR function 35, transistor $36_2$ overcomes the drive of transistor 34 and will pull node N2 low. Since the other seven read data lines 22 are low, seven of transistors 40 in NAND function 37 are on, driving node N3 high. Referring to the above truth table, the state of line TC low, node N2 low, and node N3 high will drive a high logic level on line CMPR, indicating that not all of the memory cells accessed in the parallel read operation had the same data state therein, thus indicating test failure.

As described hereinabove, transistors 40 in NAND function 37 are also sized so that the drive of any one of transistors 40 will overcome that of transistor 42. Therefore, if only one of read data lines 22 had a low logic level while all others were high, node N3 would be pulled high; NOR function 35 would drive node N2 high, also, due to the seven read data lines 22 having a high logic level. As in the prior failed case, line CMPR is again driven high, indicating the failed condition.

The construction of test data comparator 32 according to the present invention provides significant advantages over prior on-chip parallel test data comparators, particularly as the number of bits tested in parallel increases. Firstly, each internal data bus line is connected to the gates of only two transistors, rather than to pull-up and pull-down transistors in each of multiple logic functions, with such connection parallel to, rather than in series with, the data path used in normal operation. As a result, the load and delay effect of the parallel test comparison circuitry according to the present invention, on the primary data path and thus on the performance of the memory in normal operation, is minimal.

Secondly, the transistors in test data comparator 32 can be kept relatively small in size, allowing for efficient layout of the parallel test circuitry and also facilitating highly parallel comparison, as the delay through test data comparator 32 is minimal, and does not depend upon the number of test data lines compared. As such, the present invention is particularly useful for modern memories, such as dynamic RAMs, in which thirty-two or more bits may be tested in parallel. The addition of an expected data comparison into the parallel test circuitry according to the invention is also trivial, as it requires only the addition of two transistors in parallel with those receiving the internal data lines.

While memory 1 has only a single input/output terminal DQ in this example, it is of course contemplated that the present invention is applicable to other memory organizations, particularly those for which the number of memory cells accessed, either in a special test mode or in normal operation, exceeds the number of output terminals. The invention is particularly useful for memories where the number of input/output terminals DQ can be selected, for example by way of metal mask changes, as it allows those memories for which fewer terminals are selected to be tested in substantially the same test time as those for which all terminals are selected. The selection of the number of input/output terminals by way of metal masks is desirable for the manufacturer of the memories, as it allows flexibility in production planning until a relatively late stage in the manufacturing process.

While the invention has been described herein relative to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

I claim:

1. In a memory having a parallel test mode in which a plurality of on-chip data lines are compared with one another, a data comparator circuit comprising:
   a first logic function, having a first output node, comprising:
      a first pull-up device coupled between the first output node and a first bias voltage corresponding to a first logic state, for biasing the first output node to the first bias voltage; and
      a plurality of pull-down transistors, each having a conduction path coupled between the first output node and a second bias voltage corresponding to a second logic state, and each having a control terminal coupled to an associated one of said plurality of data lines;

a second logic function, having a second output node, comprising:
  a pull-down device coupled between the second output node and the second bias voltage, for biasing the second output node to the second bias voltage; and
  a plurality of pull-up transistors, each having a conduction path coupled between the second output node and the first bias voltage, and each having a control terminal coupled to an associated one of said plurality of data lines in such a manner that each of said plurality of data lines turns on either its associated pull-up transistor or its associated pull-down transistor with a digital data state communicated thereon; and
an output logic function, coupled to said first and second output nodes, for generating a pass signal responsive to said first and second output nodes being at the same logic state, and for generating a fail signal responsive to said first and second output nodes being at different logic states.

2. The circuit of claim 1, wherein said first pull-up device comprises a first transistor having its conduction path coupled between said first output node and the first bias voltage, and having a control terminal coupled to an enable line;
  wherein said pull-down device comprises a second transistor having its conduction path coupled between said second output node and the second bias voltage, and having a control terminal coupled to the enable line;
  and wherein said pull-up device and said pull-down device are each made conductive responsive to the enable line indicating that said circuit is to be enabled, and said pull-up device and said pull-down device are each made non-conductive responsive to the enable line indicating that said circuit is to be disabled.

3. The circuit of claim 2, wherein said output logic function also receives said enable line at an input, such that said output logic function is enabled to respond to the state of said first and second output nodes responsive to the enable line indicating that said circuit is to be enabled, and is disabled from responding to the state of said first and second output nodes responsive to the enable line indicating that said circuit is to be disabled.

4. The circuit of claim 3, wherein said first logic function further comprises:
  a first forcing transistor having its conduction path in parallel with said plurality of pull-down transistors, and having its gate coupled to said enable line in such a manner that the first forcing transistor is off responsive to the enable line indicating that said circuit is to be enabled, and in such a manner that the first forcing transistor is on responsive to the enable line indicating that said circuit is to be disabled;
  and wherein said second logic function further comprises:
  a second forcing transistor having its conduction path in parallel with said plurality of pull-up transistors, and having its gate coupled to said enable line in such a manner that the second forcing transistor is off responsive to the enable line indicating that said circuit is to be enabled, and in such a manner that the second forcing transistor is on responsive to the enable line indicating that said circuit is to be disabled.

5. The circuit of claim 2, wherein each of said plurality of pull-down transistors in said first logic function are sized significantly larger than said pull-up device; and wherein each of said plurality of pull-up transistors in said second logic function are sized significantly larger than said pull-down device.

6. The circuit of claim 1, wherein said pull-up transistors and said pull-down transistors are field effect transistors having opposite conductivity type relative to one another.

7. A memory in an integrated circuit, comprising:
an array of addressable memory cells;
means for selecting a plurality of said memory cells in said array;
means for sensing a stored state in said selected plurality of memory cells and communicating the sensed stored state to a plurality of data lines;
means, coupled to said plurality of data lines, for communicating the state of one of said data lines to a terminal; and
a data comparator, coupled to said plurality of data lines in parallel with said communicating means, for comparing the state of said plurality of data lines with one another, comprising:
  a first logic function, having a first output node, comprising:
    a first pull-up device coupled between the first output node and a first bias voltage corresponding to a first logic state, for biasing the first output node to the first bias voltage; and
    a plurality of pull-down transistors, each having a conduction path coupled between the first output node and a second bias voltage corresponding to a second logic state, and each having a control terminal coupled to an associated one of said plurality of data lines;
  a second logic function, having a second output node, comprising:
    a pull-down device coupled between the second output node and the second bias voltage, for biasing the second output node to the second bias voltage; and
    a plurality of pull-up transistors, each having a conduction path coupled between the second output node and the first bias voltage, and each having a control terminal coupled to an associated one of said plurality of data lines in such a manner that each of said plurality of data lines turns on either its associated pull-up transistor or its associated pull-down transistor with a digital data state communicated thereon; and
  an output logic function, coupled to said first and second output nodes, for generating a pass signal responsive to said first and second output nodes being at the same logic state, and for generating a fail signal responsive to said first and second output nodes being at different logic states.

8. The memory of claim 7, further comprising:
means for enabling said comparator responsive to an external signal indicating that a parallel test mode is to be enabled.

9. The memory of claim 8, wherein said enabling means drives an enable line at an output thereof, said enable line indicating whether said parallel test mode is enabled or disabled;
  wherein said pull-up device comprises a first transistor having its conduction path coupled between said first output node and the first bias voltage, and having a control terminal coupled to the enable line;

wherein said pull-down device comprises a second transistor having its conduction path coupled between said second output node and the second bias voltage, and having a control terminal coupled to the enable line;

and wherein said pull-up device and said pull-down device are each made conductive responsive to the enable line indicating that said circuit is to be enabled, and said pull-up device and said pull-down device are each made non-conductive responsive to the enable line indicating that the parallel test mode is to be disabled.

10. The memory of claim 9, wherein said output logic function also receives said enable line at an input, such that said output logic function is enabled to respond to the state of said first and second output nodes responsive to the enable line indicating that the parallel test mode is to be enabled, and is disabled from responding to the state of said first and second output nodes responsive to the enable line indicating that the parallel test mode is to be disabled.

11. The memory of claim 10, wherein said first logic function further comprises:
 a first forcing transistor having its conduction path in parallel with said plurality of pull-down transistors, and having its gate coupled to said enable line in such a manner that the first forcing transistor is off responsive to the enable line indicating that the parallel test mode is to be enabled, and in such a manner that the first forcing transistor is on responsive to the enable line indicating that the parallel test mode is to be disabled;

and wherein said second logic function further comprises:
 a second forcing transistor having its conduction path in parallel with said plurality of pull-up transistors, and having its gate coupled to said enable line in such a manner that the second forcing transistor is off responsive to the enable line indicating that the parallel test mode is to be enabled, and in such a manner that the second forcing transistor is on responsive to the enable line indicating that the parallel test mode is to be disabled.

12. The memory of claim 9, wherein each of said plurality of pull-down transistors in said first logic function are sized significantly larger than said pull-up device;

and wherein each of said plurality of pull-up transistors in said second logic function are sized significantly larger than said pull-down device.

13. The memory of claim 7, wherein said pull-up transistors and said pull-down transistors are field effect transistors having opposite conductivity type relative to one another.

14. A method of comparing the data state of a plurality of memory cells in a semiconductor memory, comprising:

biasing a first node to a first voltage, said first node also coupled to a second voltage via a first plurality of transistors, said first and second voltages corresponding to different logic levels, each of said first plurality of transistors having a control terminal coupled to an associated one of a plurality of data lines in such a manner so as to be conductive responsive to its associated data line being at a first logic level and non-conductive responsive to its associated data line being at a second logic level, wherein a conductive one of said first plurality of transistors will pull said first node to said second voltage;

biasing a second node to the second voltage, said second node also coupled to the first voltage via a second plurality of transistors, each of said second plurality of transistors having a control terminal coupled to an associated one of said plurality of data lines in such a manner so as to be conductive responsive to its associated data line being at the second logic level and nonconductive responsive to its associated data line being at the first logic level, wherein a conductive one of said second plurality of transistors will pull said second node to said first voltage;

communicating a data state stored in each of said plurality of memory cells to said plurality of data lines; and after said communicating step, generating a signal indicating a pass condition responsive to said first and second nodes being at the same logic level, and indicating a fail condition responsive to said first and second nodes being at different logic levels.

15. The method of claim 14, further comprising:
receiving a signal indicating that a parallel test mode is to be enabled;
wherein said biasing steps are performed responsive to said receiving step.

16. The method of claim 15, further comprising:
generating an enable signal responsive to said receiving step;
wherein said step of biasing said first node comprises:
 turning on a first biasing transistor, having its conduction path coupled between said first node and the first voltage;
and wherein said step of biasing said second node comprises:
 turning on a second biasing transistor, having its conduction path coupled between said second node and the second voltage.

17. The method of claim 16, further comprising:
receiving a signal indicating that a parallel test mode is to not be enabled and generating a disable signal responsive thereto; and
responsive to the generating of a disable signal, turning on a first forcing transistor having its conduction path coupled between said first node and the second voltage, and turning on a second forcing transistor having its conduction path coupled between said second node and the first voltage.

* * * * *